US006236208B1

United States Patent
Ham et al.

(10) Patent No.: US 6,236,208 B1
(45) Date of Patent: May 22, 2001

(54) MAGNETIC RESONANCE IMAGING APPARATUS INCLUDING A GRAIDENT COIL SYSTEM WITH A CORRECTION COIL

(75) Inventors: Cornelis L. G. Ham; Gerardus B. J. Mulder; Gerardus N. Peeren, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/421,647

(22) Filed: Oct. 20, 1999

(30) Foreign Application Priority Data

Oct. 20, 1998 (EP) .................................................. 98203540

(51) Int. Cl.$^7$ ...................................................... G01V 3/00
(52) U.S. Cl. ............................ 324/318; 324/322; 324/300
(58) Field of Search ...................................... 324/318, 322, 324/309, 307, 300

(56) References Cited

U.S. PATENT DOCUMENTS

| 4,644,277 | 2/1987 | Kunz ..................................... 324/309 |
| 4,959,613 | 9/1990 | Yamamoto et al. ................... 324/318 |
| 5,235,279 | 8/1993 | Kaufman et al. ..................... 324/309 |
| 5,311,135 | 5/1994 | Vavrek et al. ........................ 324/318 |
| 5,574,373 | 11/1996 | Pausch et al. ........................ 324/318 |
| 5,736,858 | 4/1998 | Katznelson et al. ................. 324/318 |

FOREIGN PATENT DOCUMENTS

521660 * 7/1993 (EP) .

OTHER PUBLICATIONS

"The Modular Gradient Coil—A New Concept in High Performance Whole–Body Gradient Coil Design" by Paul R. Harvey and Ehud Katzonelson in Proceedings of the International Society for Magnetic Resonance in Medicine, Fifth Scientific Meeting and Exhibition, Vancouver, B.C., Canada, Apr. 12–18, 1997, vol. 2, p. 1467. (abstract).

"New Spatial Localization method Using Pulsed High–Order Field Gradients (SHOT: Selection with High–Order gradient)" by C.H. Oh et al. in Magnetic Resonance in Medicine, U.S. Academic Press, Duluth, MN, vol. 18, No. 1, pp. 63–70.

* cited by examiner

*Primary Examiner*—Jay Patidar
*Assistant Examiner*—Brij B. Shrivastav
(74) *Attorney, Agent, or Firm*—John F. Vodopia (57) ABSTRACT

The design of a gradient system may be aimed at a high degree of linearity of the gradient field or a high speed during the generating of the gradient pulses, depending on the wishes of the user. These two wishes imply contradictory design criteria. In order to comply with both user wishes, the gradient system 32, 34, 36, 38 according to the invention is constructed so as to include a gradient coil 32 having a comparatively poor linearity, and a correction coil 36 which is intended to correct the linearity of the gradient coil; the linearity of the correction coil 36 itself thus is not important. The linearity of the system is enhanced, relative to that of the gradient coil alone, by addition of the fields of the two coils 32, 36. If a high speed is desired at the expense of the linearity, the gradient coil 32 alone may be activated; if a high linearity is desired at the expense of the speed, both coils 32, 36 can be switched on. The apparatus is provided with switching means 58, 60, 62, 64 for driving the gradient coil and the correction coil 36 mutually independently or not, as desired, and with a first and a second drive amplifier 54, 56 for driving the first coil 32 and the second coil 36, respectively.

9 Claims, 10 Drawing Sheets

MAGNETIC RESONANCE IMAGING APPARATUS INCLUDING A GRAIDENT COIL SYSTEM WITH A CORRECTION COIL

BACKGROUND OF THE INVENTION

1. Field of the Invention

The invention relates to a magnetic resonance imaging apparatus which includes a gradient coil system for generating a magnetic gradient field in an imaging volume of the apparatus, the gradient coil system including a first coil for generating a first part of the gradient field, and a second coil for generating a second part of the gradient field.

2. Description of Related Art

A magnetic resonance imaging apparatus of this kind is known from U.S. Pat. No. 5,311,135.

A magnetic resonance imaging apparatus for medical purposes, also referred to as an MRI apparatus, is arranged to form images of cross-sections of a body. To this end, in such an apparatus a strong, homogeneous field is generated in a volume intended for imaging (the imaging volume) in known manner. On this homogeneous field a gradient field is superposed in order to indicate the location of the cross-section to be imaged. The gradient field is realized by conducting a time-dependent current through a gradient coil. This time-dependent current signal varies in a pulse-like manner, the pulse being shaped approximately as a trapezium. The rise times are of the order of magnitude of from 0.2 to 0.6 ms and the pulse duration (i.e. the duration of the more or less constant part of the pulse) is of the order of magnitude of from 1 to 5 ms.

Depending on the intended application and/or the user's wishes, the design of a gradient coil system may be aimed at achieving a more or less high degree of linearity of the gradient field or a more or less high speed in generating the gradient pulses.

In this context linearity is to be understood to mean the degree of constancy across the imaging volume of the (spatial) derivative of the field strength of the gradient field (for example, the derivative of the z component of the gradient field to the x co-ordinate: $dB_z/dx$). For non-distorted images a high degree of linearity is pursued in the imaging volume. For reasons of power efficiency, during the generating of a very linear field the field outside the imaging volume is preferably decreased to zero as quickly as possible (i.e. over an as short as possible distance from the imaging volume). This is because the power required for generating a magnetic field is proportional to the volume integral of the square of the field strength. These two requirements (linearity within the imaging volume and fast field decrease outside the imaging volume) must be satisfied in the practical circumstances of an MRI apparatus, i.e. the imaging volume may not be completely enclosed by current conductors, because this volume must remain accessible by a patient, and the current conductors may not be arranged directly on the boundary surface of the imaging volume. Considering the electromagnetic field theorem, in these circumstances said requirements as regards linearity and fast field decrease are not compatible, so that a comparatively high power is required in order to generate a very linear field.

There are also MRI applications in which significant importance is attached to a high speed and linearity is less important. Such applications are encountered in situations in which images must be formed at a high speed, for example in the case of moving parts of the body. Examples in this respect are the observation of a beating heart or the tracking of the progress of a contrast medium in a vascular system as it occurs during perfusion imaging of the brain. As is known, in MRI the resolution of the image to be formed (i.e. the number of pixels that can still be distinguished from one another in the slice to be imaged) is proportional to the surface area of the gradient pulse. For example, if the speed is made twice as high while the resolution remains the same, so for the same surface area of the gradient pulse, the amplitude of the pulse will have to be twice as high; this means that the slope of the pulse edges of the trapezium-shaped pulses should become four times as high, so that the driving voltage V for this coil (behaving practically as a pure self-inductance L, i.e. $V=L(dI/dt)$) should also become four times as high. Because the current amplitude I has thus become twice as high, the peak power V×I becomes eight times as high. This numerical example clearly illustrates the problem concerning the driving power required in the case of a high speed.

Therefore, if a gradient system were desired which is capable of producing a high degree of linearity as well as a high speed, driving amplifiers designed to deliver a very high power would be required; this is objectionable. Moreover, a high driving power is accompanied by a high heat dissipation, giving rise to cooling problems and mechanical instability due to thermal drift.

The MRI apparatus described in the cited United States patent includes a gradient coil system which consists of a series connection of a first and a second coil, either the first coil alone or the first as well as the second coil being excited. Such a method of operating the coil system enables an increased speed of acquisition of the images in the case of a part of a patient to be imaged which is smaller than the imaging volume. A situation of this kind occurs, for example when images are formed of the human brain which has dimensions of the order of magnitude of 20 cm, whereas the diameter of the imaging volume is approximately 45 cm. The gradient field will be more linear across said 20 cm than across the diameter of 45 cm, so that the requirement in respect of linearity across the entire imaging volume may be less severe in this case. The reduction of the linearity may then be of benefit to an increased speed. If only the first coil is excited, a fast magnetic field having a given linearity can be realized in a given imaging volume. When the first as well as the second coil is energized, the volume having said given linearity will be larger than the imaging volume in the first case or, in other words, when both coils are excited, the linearity within the former volume, so the imaging volume, will be higher.

Thus, in the known MRI apparatus a choice can be made between a first gradient mode in which only the first coil is activated, so that only this first coil is excited whereas the second coil is not, and a second gradient mode in which the first and the second coil are activated together, so that the same current flows through the two coils. Selection between said two gradient modes thus enables the user to choose either a comparatively high linearity with a comparatively low speed or a high speed with a low linearity.

The second coil shown in the cited United States patent is proportioned in such a manner that it produces a field whose linear component constitutes a significant part of the linear component of the total field produced by the gradient system. This means that when the second coil is deactivated, the total linear field component is reduced by an amount which is not negligibly small, so that in that case the excitation of the first coil must be increased by a corresponding amount so as to achieve the same strength of the total linear field component; this has an adverse effect on the power efficiency during the generating of the linear field.

Citation of a reference herein, or throughout this specification, is not to be construed as an admission that such reference is prior art to the Applicant's invention of the invention subsequently claimed.

SUMMARY OF THE INVENTION

It is an object of the invention to provide an MRI apparatus of the kind set forth which offers a larger number of possibilities for use in respect of linearity and speed of the gradient field to be generated, without making major concessions in respect of the power efficiency during the generating of the gradient field.

To achieve this, the magnetic resonance apparatus according to the invention is characterized in that the second coil is proportioned in such a manner that in the second part of the gradient field generated by this coil the ratio $R=(\max_{dev})/(\max_{lin})$ is larger than 1, where $\max_{lin}$ is the maximum value of the linear component of the second part of the gradient field in the imaging volume and $\max_{dev}$ is the maximum value of the deviation of the linear component of the second part of the gradient field in the imaging volume, that the apparatus is provided with switching means for driving the first coil and the second coil mutually independently or not, as desired, and that the apparatus also includes a first and a second drive amplifier for driving the first coil and the second coil, respectively.

In the technique of MRI an actual gradient field is assumed to be composed of the sum of an ideal linear field and the deviation of the actual gradient field with respect to said ideal linear field. As is customary in this technique, the linearity of a gradient field in a given volume is characterized by the ratio $R=(\max_{dev})/(\max_{lin})$. Therein, $\max_{lin}$ is the maximum value of the ideal linear field in the volume and $\max_{dev}$ is the maximum value of the deviation of the actual gradient field in the volume relative to the maximum value of the ideal linear field.

In conformity with a basic rule of electromagnetic field theory, the maximum value of a magnetic field on a given closed surface (in this case being the surface of the imaging volume) is equal to the maximum value of said field in the volume enclosed by said surface (in this case being the imaging volume); this means that said maximum values can be determined by determination of the relevant field strength on the surface.

How to form a coil whose field to be formed is given is known per se to those killed in the art, so that a person skilled in the art can derive the desired coil shape without undue effort from the described requirements imposed as regards the gradient field. A method of this kind is described, for example in U.S. Pat. No. 5,574,373.

A value of R which is of the order of magnitude of from 0.05 to 0.15 is associated with a very linear gradient coil (i.e. a coil producing a very linear field) in practice. Therefore, when a coil produces a field with a value for R which is larger than 1, (the field of) this coil has to be very non-linear.

The gradient field to be formed can thus be formed by a number of feasible combinations of the first coil and the second coil. The first coil may then be a very linear coil or a coil having less linear properties; in that case the properties of the second coil must be chosen in such a manner that the combination can offer the desired linearity or speed. Three cases will be described in detail hereinafter.

1) The gradient system according to the invention may consist of the combination of a very linear coil (the first coil) and a very non-linear coil (the second coil). If in that case a high speed is required during the generating of the gradient pulses, the sum of the fields of the first and the second coil can be taken for the total gradient field, so overall a comparatively non-linear field which, as is known, allows for a high speed. However, if in that case a high degree of linearity is required, merely the field of the first coil can be taken for the total gradient field, so overall a comparatively linear field.

2) The gradient system according to the invention may also consist of the combination of a comparatively non-linear coil (the first coil) and a very non-linear coil (the second coil). In that case the second coil is proportioned in such a manner that the field of this coil yields a very linear field when it is added to the field of the first coil. If a high speed is desired for the generating of the gradient pulses in this case, merely the field of the first coil can be used for the total gradient field, so overall a comparatively non-linear field. However, if in this case a high degree of linearity is desired, the sum of the fields of the first and the second coil can be taken for the total gradient field, so overall a very linear field.

3) An intermediate situation is feasible in which the linearity of the first coil lies between that of the former case and that of the latter case. For this intermediate situation the field of the second coil is applied in the same direction as that of the first coil in order to obtain a very linear field, whereas the field of the second coil is applied so as to oppose that of the first coil in order to realize a resultant non-linear field. Also feasible is an intermediate situation in which the second coil is not energized.

It is of essential importance to the invention that the two coils can be driven independently. For example, if it were contemplated to drive each of the coils of the prior art coil system by means of a respective drive amplifier, it might happen that a voltage amounting to the sum of the drive voltages arises across one of the drive amplifiers, unless the output stages of these amplifiers are constructed so as to be floating. In the first case output transistors are required which are capable of withstanding such high voltages; this is a major problem in the case of gradient amplifiers with high output voltages (of the order of magnitude of approximately ½ kV per amplifier) and large output currents (as large as many hundreds of amperes). In the second case special steps would have to be taken so as to ensure electrical isolation of the output stages of the amplifiers from their input stages; this is objectionable notably for said comparatively high voltages.

In an embodiment of the invention the switching means for driving the first and the second coil mutually independently or not, as desired, are arranged to connect, as desired, the two coils in series or to connect each of the coils to the respective drive amplifier associated with each of the coils. In given circumstances it may be desirable to energize the two coils with exactly the same current. In that case preference may be given to a series connection of the two coils, which series connection is then connected to one drive amplifier. In other circumstances a respective signal wave form may be desirable for each of the two coils so that in that case no coupling may exist between the two coils.

The switching means in a further embodiment of the invention are arranged to switch over from a first gradient mode to a second gradient mode during the execution of one scan operation. In this context a gradient mode is to be understood to mean a given mode of energizing of the two coils, for example series connection with common energizing, energizing of each of the coils separately, energizing of the second coil in the same direction as the first coil, or energizing of the second coil in the direction opposing that of the first coil as described above.

The first coil in another embodiment of the invention is provided with an associated shielding coil, the second coil also being provided with an associated shielding coil. As a result of this step, suitable shielding of the gradient system is achieved even when the first and the second coil are driven independently of one another with mutually different signals.

In a further embodiment of the invention, an intermediate space is formed between the first coil and the associated shielding coil, the second coil being accommodated in said intermediate space. From a point of view of power efficiency it is very desirable that the diameter of gradient coils (i.e. the field generating coils) remains as small as possible, the lower limit of the diameter being determined by the dimensions of the patients to be examined. On the other hand, a given distance should exist between the field generating coil and the shielding coil, since the shielding coil would otherwise excessively oppose the field to be generated, the upper limit of the diameter being determined by the dimensions of the coils for generating the constant magnetic field. When these two requirements result in an intermediate space between the field generating coil and the shielding coil, such an intermediate space can be used to arrange the second coil therein so that its diameter becomes as small as possible.

The shielding coil associated with the second coil in another embodiment of the invention is also arranged in the intermediate space. This step again benefits the desire to achieve suitable power efficiency for the same reasons as described above for the second coil itself.

A further embodiment of the apparatus according to the invention is provided with an RF coil which is arranged within the first coil, the second coil being constructed as a split coil which consists of two sub-coils, each of the sub-coils being situated to both sides of the RF coil within the first coil. In an MRI apparatus on the one hand there is a need for an as large as possible space for accommodating the patient in the imaging volume, but on the other hand there is a need for an as small as possible diameter of the gradient coils because of the already described desirable power efficiency. Consequently, the gradient coils are arranged as near as possible to the imaging volume, and the RF coil still has to be arranged between the imaging volume and the gradient coils. In that case there is no room for the second coil in the vicinity of the imaging volume and this second coil would thus have to have a large diameter which has a detrimental effect on the power efficiency. The second coil can now be subdivided into two sub-coils which are arranged to both sides of the RF coil, so that the diameter of these sub-coils can still remain limited.

BRIEF DESCRIPTION OF THE DRAWING

The invention will be described in detail hereinafter with reference to the Figures. Therein:

FIG. 4a shows the part of the gradient field generated by the x gradient coil shown in FIG. 3a;

FIG. 6a shows the part of the gradient field generated by the z gradient coil shown in FIG. 5a;

DETAILED DESCRIPTION OF THE PREFERRED EMBODIMENT

Figure 1:
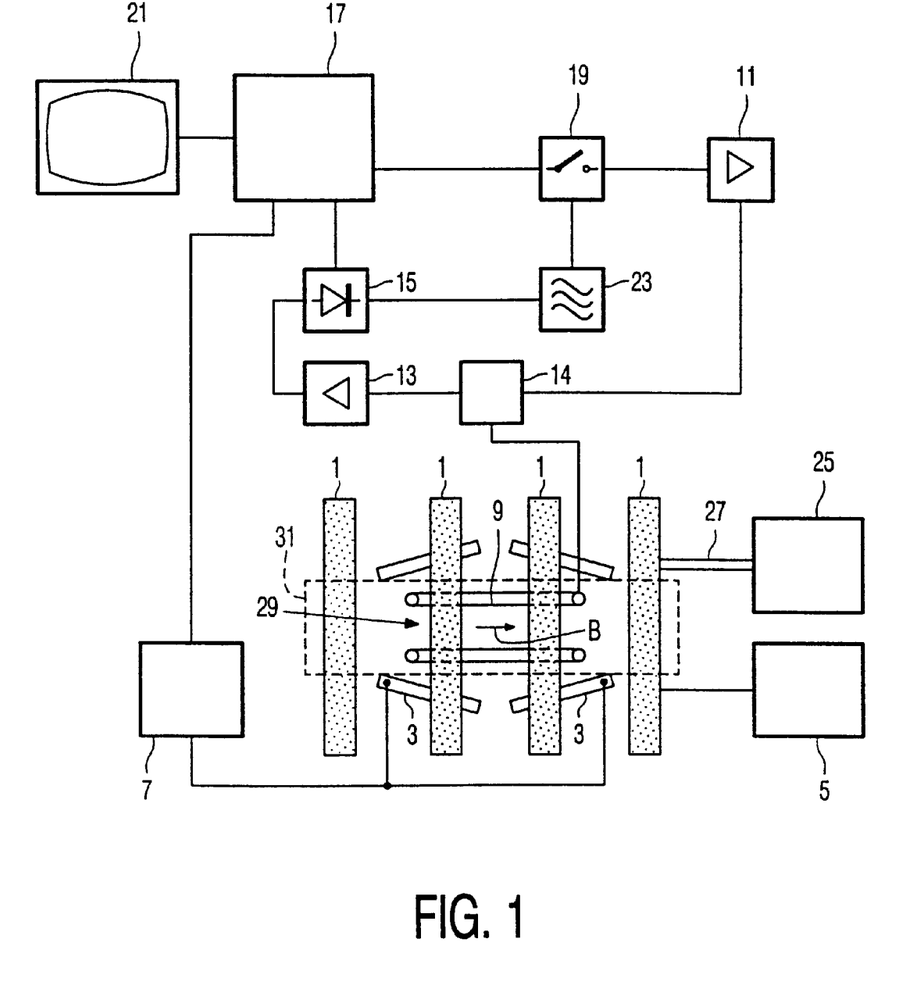
FIG. 1 shows diagrammatically the general construction of a magnetic resonance imaging apparatus.

The magnetic resonance imaging apparatus which is diagrammatically shown in FIG. 1 includes a first magnet system 1 for generating a steady, homogeneous magnetic field, a second magnet system 3 (the gradient coil system) for generating magnetic gradient fields, a power amplifier 7 for the gradient coil system 3, and a power supply device 5 for the first magnet system 1. An RF coil 9 serves to generate an RF magnetic alternating field; to this end it is connected to an RF transmitter device which includes an RF source 11. The RF coil 9 can also be used for the detection of spin resonance signals generated by the RF transmitter field in an object to be examined (not shown); to this end, the RF coil is connected to an RF receiver device which includes a signal amplifier 13. The output of the signal amplifier 13 is connected to a detector circuit 15 which is connected to a central control device 17. The central control device 17 also controls a modulator 19 for the RF source 11, the power amplifier 7 and a monitor 21 for image display. An RF oscillator 23 controls the modulator 19 as well as the detector 15 which processes measuring signals. A cooling device 25 with cooling ducts 27 is provided for cooling the magnet coils of the first magnet system 1. The RF coil 9, arranged within the magnet systems 1 and 3, encloses a measuring space (imaging volume) 29 which, in the case of an apparatus for medical diagnostic measurements, is spacious enough to accommodate a patient to be examined or a part of a patient to be examined, for example the head and the neck. Thus, a steady magnetic field, gradient fields for selecting object slices, and a spatially homogeneous RF alternating field can be generated within the imaging volume 29. The RF coil 9 can combine the functions of transmitter coil and measuring coil; in that case a separator circuit 14 is provided in order to separate the forward and return signal traffic. Alternatively, different coils can be used for the two functions; for example, surface coils then act as measuring coils. If desired, the coil 9 may be enclosed by an RF field shielding Faraday cage 31.

Figure 2:
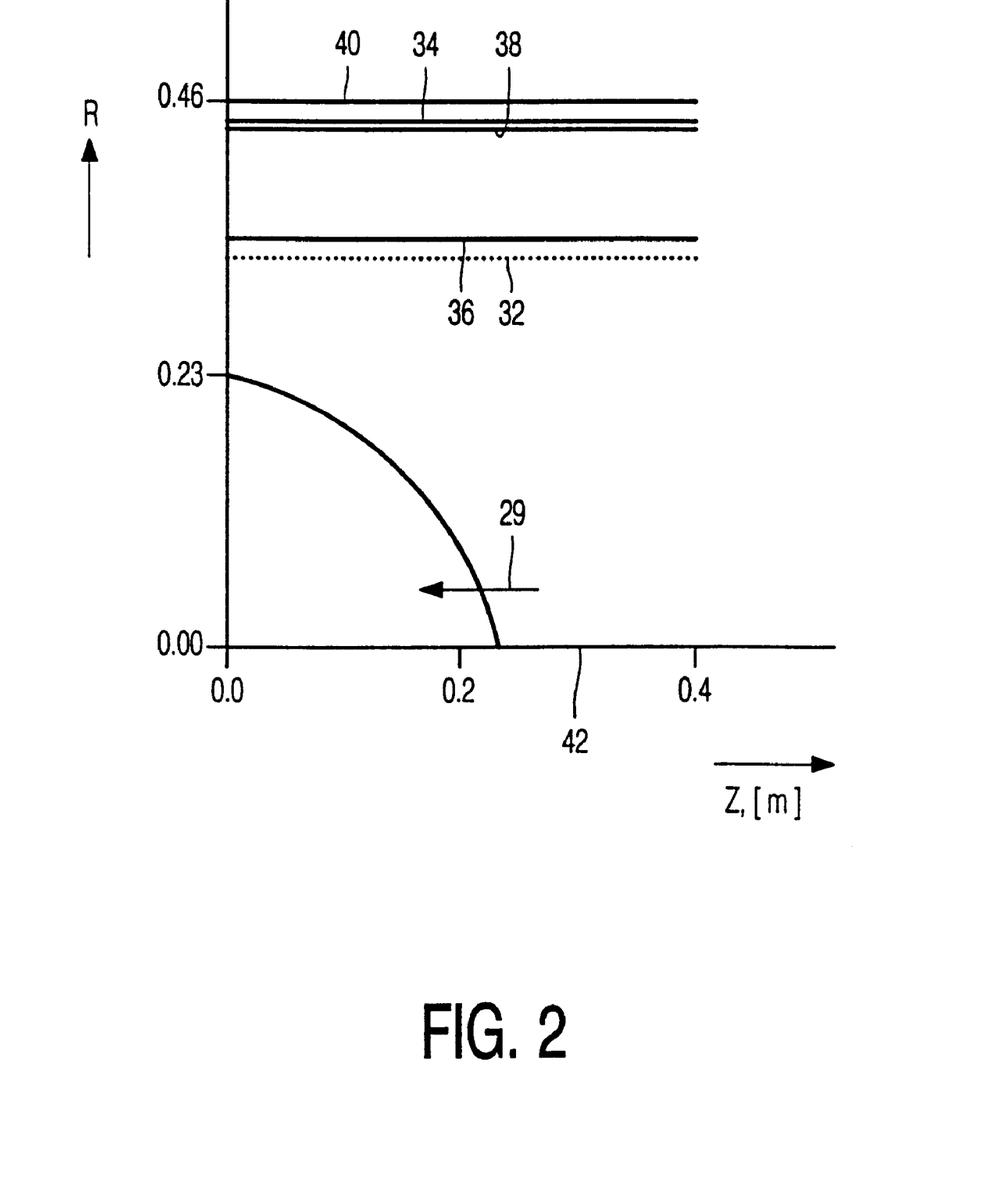
FIG. 2 shows diagrammatically the positioning of the coils associated with the gradient coil system according to the invention.

FIG. 2 shows diagrammatically the positioning of the coils associated with the gradient coil system 3 (see FIG. 1). The horizontal lines 32, 34, 36, 38 and 40 in FIG. 2 represent intersections of cylindrical surfaces and the plane of drawing. The common axis of these cylinders is formed by the z axis 42. The various coils of the gradient coil system have a predominantly cylindrical shape as will be described in detail with reference to the various Figures.

The gradient coil system of FIG. 2 includes a first coil 32 for generating a first part of the gradient field. This first part of the gradient field is the predominantly linear part of the gradient field, even though this field according to the invention need not be linear to a high degree. As has already been stated, the ratio parameter $R=(\max_{dev})/(\max_{lin})$ can be chosen as a measure of the linearity of a gradient field. This value may amount to 0.15 for the part of the gradient field generated by the coil 32. Because the part of the gradient field generated by this coil is predominantly linear, this coil 32 will be referred to hereinafter as the gradient coil. The gradient coil 32 is provided in known manner with an associated shielding coil 34 for shielding the environment from the magnetic fields generated by the gradient coil 32.

Between the gradient coil 32 and the associated shielding coil 34 there exists an intermediate space in which a second coil 36 for generating a second part of the gradient field is accommodated. This second part of the gradient field is a predominantly non-linear part of the gradient field. For the part of the gradient field generated by the coil 36 the ratio parameter R may have a value larger than 1. The coil 36 serves to correct the imperfections in respect of the linearity of the field generated by the gradient coil 32, so that the value of R for the total gradient field generated by the two coils 32 and 36 has a value which is lower than the value R for the field generated by the gradient coil 32 alone. For this reason the second coil 36 will be referred to hereinafter as the correction coil. The correction coil 36 is also provided with an associated shielding coil 38 for shielding the environment from the magnetic fields generated by the correction coil 36.

The physical boundary of the space in which the gradient coil system 32 to 40 is accommodated is formed by the cylindrical bore 40 of the magnet system 1 (see FIG. 1) for generating the steady, homogeneous magnetic field whose direction is that of the z axis. The combination of the homogeneous magnetic field and the gradient field generated by the coils 32 to 40 defines the rotationally symmetrical imaging volume 29 whose dimension in the z direction may deviate from the dimension in the x direction, so that this imaging volume 29 has the shape of an ellipsoid of revolution.

Figure 3A:
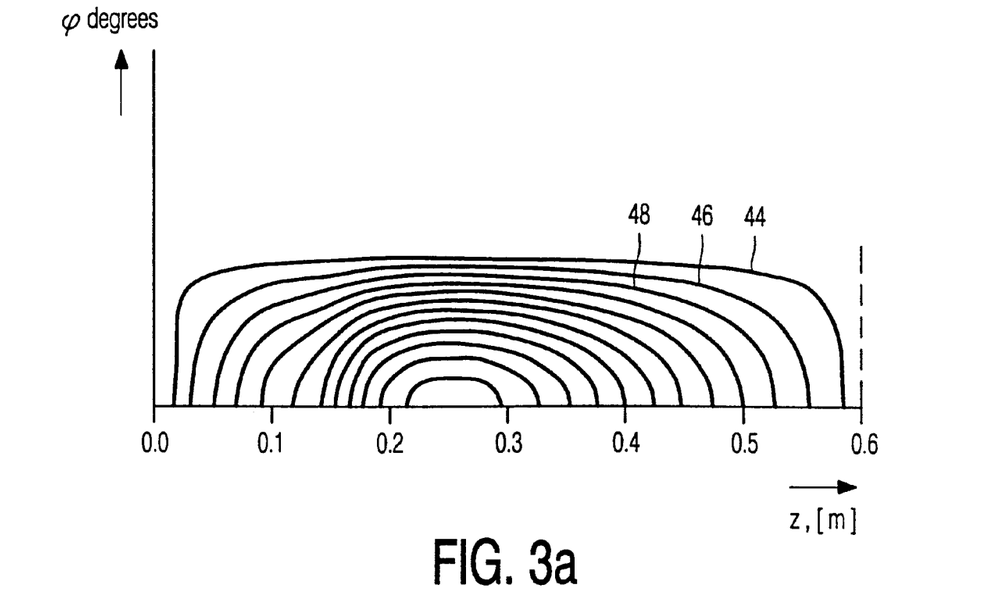
FIG. 3a shows the shape of an x gradient coil for use in a gradient coil system according to the invention.

FIG. 3a shows the shape of an x gradient coil 32 (see FIG. 2) for use in the gradient coil system according to the invention. The gradient coil 32 is composed of a metal plate, for example a copper plate, which is situated in the plane of drawing. Because of the symmetry in this gradient coil, FIG. 3a shows only a part of the complete coil. The complete coil is derived from this Figure by mirroring the coil shape relative to the horizontal axis; this yields a figure whose φ values range from −90° to +90°. The figure thus obtained is mirrored again relative to the vertical axis z=0. The figure thus obtained is then assumed to extend around a cylinder with the z axis extending parallel to the cylinder axis, so that the interval of φ values from −90° to +9° coincides with half the circumference of the cylinder surface. The pattern thus obtained on the cylinder surface is mirrored again relative to a mirror plane through the cylinder axis which contains the values φ=−90° and φ=+90°. The ultimate turns of the coils are then obtained by providing the metal plate with saw cuts in a given line pattern, so that the conductors are formed by the metal strips situated between the saw cuts. The line pattern as shown in FIG. 3a, such as the lines 44, 46 and 48, however, is not identical to the line pattern of the saw cuts; the line pattern shown in the Figure represents the point of gravity of the currents in the metal strips. Said saw cuts could in this Figure be imagined to be situated approximately halfway between the lines shown therein. In FIG. 3a the distance z from the symmetry plane z=0 is indicated horizontally and vertically the arc angle φ on the (circular) cylinder surface as from an arbitrary point φ=0 is plotted.

Figure 3B:
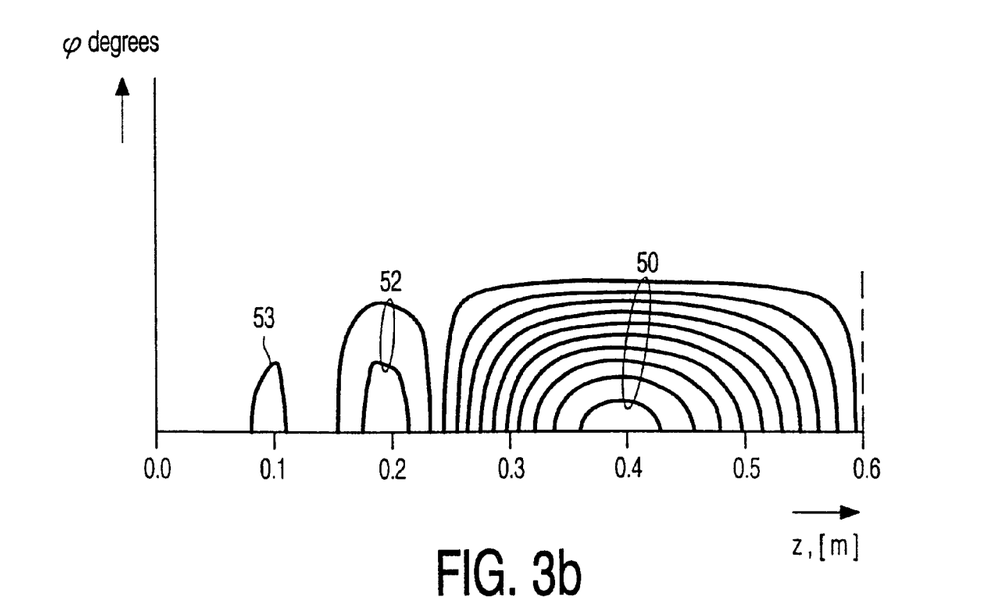
FIG. 3b shows the shape of an x correction coil for use in a gradient coil system according to the invention.

FIG. 3b shows the shape of an x correction coil 36 (see FIG. 2) for use in the gradient coil system according to the invention. This coil has the same symmetries as the gradient coil shown in FIG. 3a, and the complete correction coil can be derived from FIG. 3b in the same way as described with reference to FIG. 3a. This correction coil is again formed from a metal plate provided with saw cuts as previously described with reference to FIG. 3a.

Figure 4A:
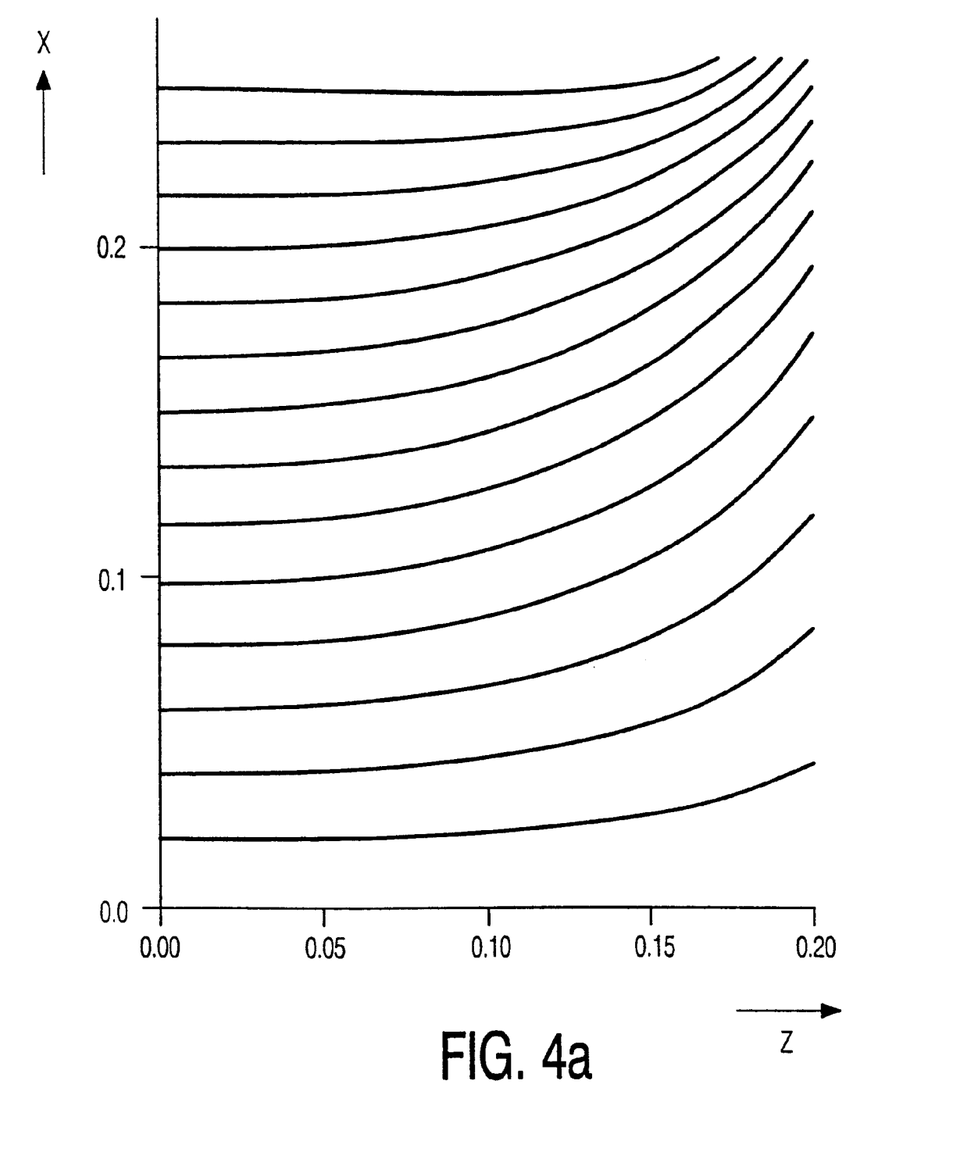

FIG. 4a shows the part of the gradient field which is generated by the x gradient coil 32 of FIG. 3a. In FIG. 4a the distance z from the symmetry plane z=0 is plotted horizontally and the distance x from the plane x=0, extending through the cylinder axis but otherwise to be selected at random, is plotted vertically. In practice the direction perpendicular to the top of the patient table, i.e. the vertical direction, is chosen as the x direction. The field shown in FIG. 4a forms the z component $B_z$ of the gradient field to be generated. The field shown in FIG. 4a is represented by means of lines of equal field strength. The Figure shows the lines associated with a field strength n×200 μT; this means that the field strength on the $n^{th}$ line in the vertical direction as from x=0 has said value of the field strength. This Figure clearly shows that the gradient field shown is a predominantly linear field, because the derivative of the z component of the gradient field to the x co-ordinate $dB_z/dx$, i.e. the distance between the successive lines of equal field strength, is practically constant. This is notably the case on the line z=0, so on the x axis. The variation of said quantity on the line z=0.2 reveals that the field shown exhibits deviations from the ideal linearity. The field shown in this Figure has been generated by means of a current of approximately 140 A through the current lines (such as the lines 44, 46 and 48) shown in FIG. 3a. Overall, a current of approximately 1600 A has thus traversed the twelve current lines shown therein.

Figure 4B:
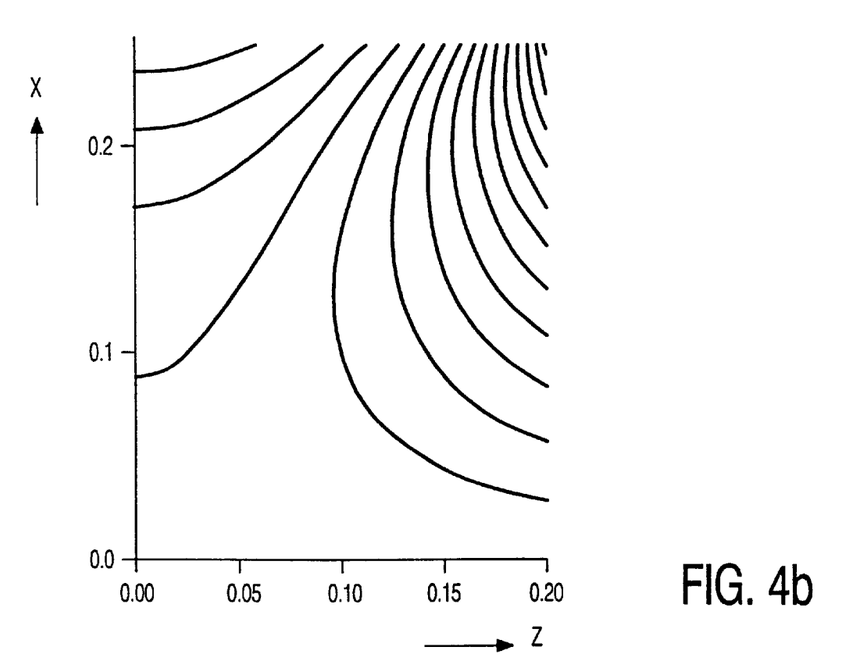
FIG. 4b shows the part of the gradient field generated by the x correction coil shown in FIG. 3b.

FIG. 4b shows the part of the gradient field which is generated by the x correction coil 36 shown in FIG. 3b. The field shown in FIG. 4b forms the z component $B_z$ of the correction field to be generated. As opposed to the values in FIG. 4a, FIG. 4b shows the lines which are associated with a field strength n×100 μT, i.e. the field strength on the $n^{th}$ line in the vertical direction as from x=0 has said value of the field strength, the lines on the diagonal from the bottom left to the top right successively corresponding to the values n=0, n=−1, n=−2, etc. This Figure clearly shows that the correction field shown is by no means a linear field, because the derivative of the z component of this field to the x co-ordinate $dB_z/dx$, i.e. the distance between the successive lines of equal field strength, is practically certainly not constant. This field can then be used to correct the field shown in FIG. 4a, i.e. a field shape with a linearity which is substantially higher than that of FIG. 4a is obtained by addition of the correction field of FIG. 4b to the gradient field of FIG. 4a. The field shown in this Figure has been generated with a current of approximately 130 A through the current lines 50 as shown in FIG. 3b, meaning overall a current of approximately 1300 At in these current lines; furthermore, a current of the same value and the opposite direction traversed the current lines 52, meaning an overall current of approximately 260 At in the current lines 52; finally, a current of the same value and the same direction was present in the current line 53. Thus, an overall current of approximately 1170 At has traversed the current lines shown in FIG. 3b.

Figure 4C:
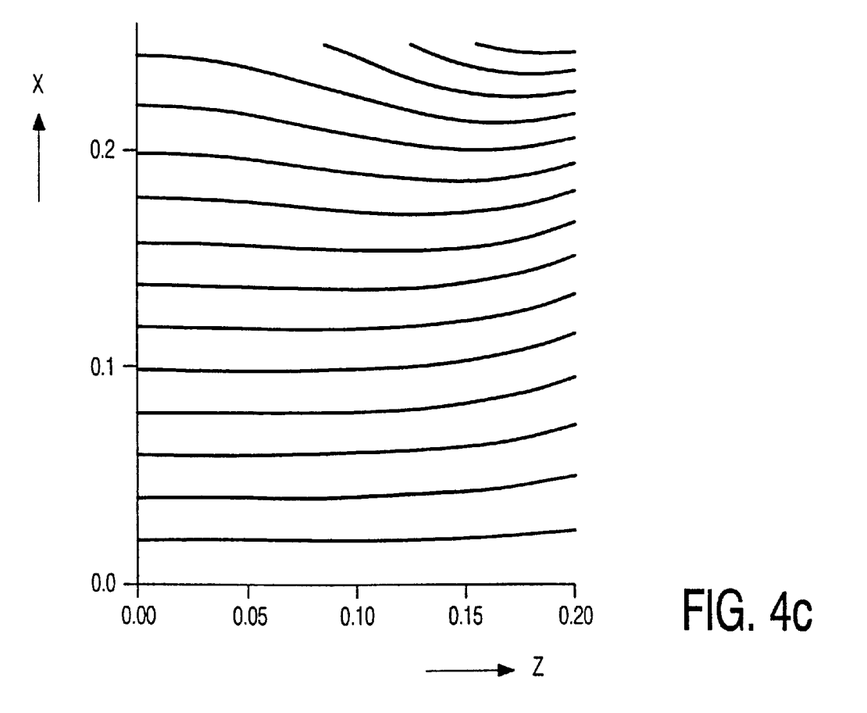
FIG. 4c shows the total x gradient field generated by the combination of the x gradient coil of FIG. 3a and the x correction coil of FIG. 3b.

FIG. 4c shows the total x gradient field obtained by addition of the gradient field of the x gradient coil of FIG. 3a and the correction field of the x correction coil of FIG. 3b. Like in FIG. 4a, FIG. 4c shows the lines associated with a field strength n×200 µT. This Figure clearly shows that the gradient field shown is linear to a higher degree than the field shown in FIG. 4a, because the distance between the successive lines of equal field strength is constant to a higher degree. This can be seen notably on the line z=0.2 where the variation of the distances between the successive lines of equal field strength is not yet completely constant, but the differences between the distances are smaller than in the case of FIG. 4a.

Figure 5A:
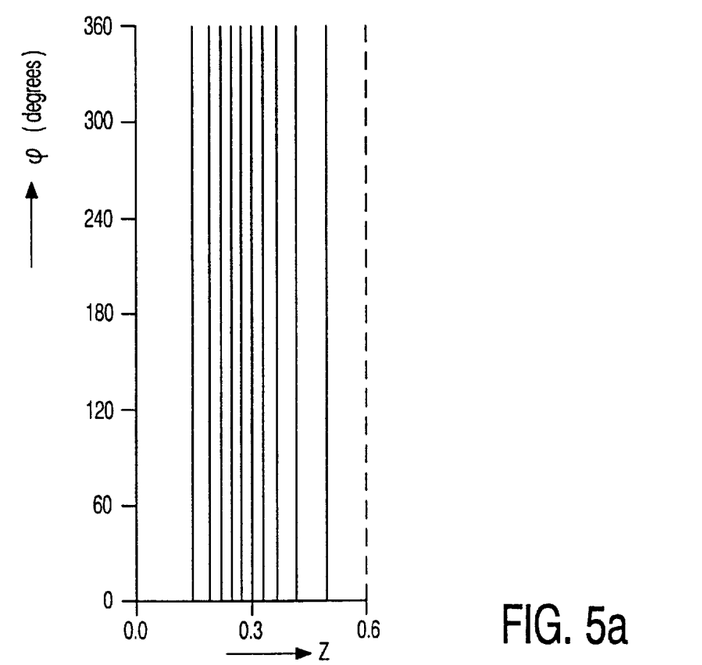
FIG. 5a shows the shape of a z gradient coil to be used in a gradient coil system according to the invention.
Figure 5B:
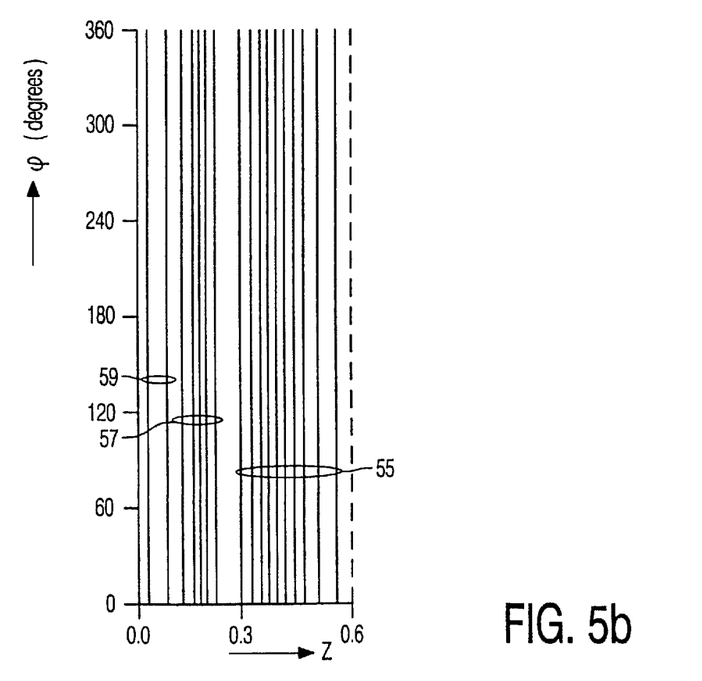
FIG. 5b shows the shape of a z correction coil to be used in a gradient coil system according to the invention.

The FIGS. 5a and 5b show the shape of a z gradient coil (FIG. 5a) and a z correction coil (FIG. 5b) for use in a gradient coil system according to the invention. Like, for example the gradient coil of FIG. 3a, these coils may be formed from a copper plate which is situated in the plane of drawing. Considering the rotationally symmetrical shape of these coils, however, it is more evident to wind these coils from wire-shaped conductors. In that case the line pattern shown in the Figure again represents the point of gravity of the currents in the wire-shaped conductors; this can be achieved by arranging these conductors closer or less close to one another in space. Because of the symmetry in this gradient coil, the FIGS. 5a and 5b show only half of the entire coil. The complete coil pattern is derived from these Figures by mirroring the coil shape relative to the vertical axis z=0. The complete coil is obtained by imaging the pattern thus obtained to be present around a cylinder with the z axis parallel to the cylinder axis so that the interval of $\phi$ values from 0 to 360° coincides with the entire circumference of the cylindrical surface.

Figure 6A:
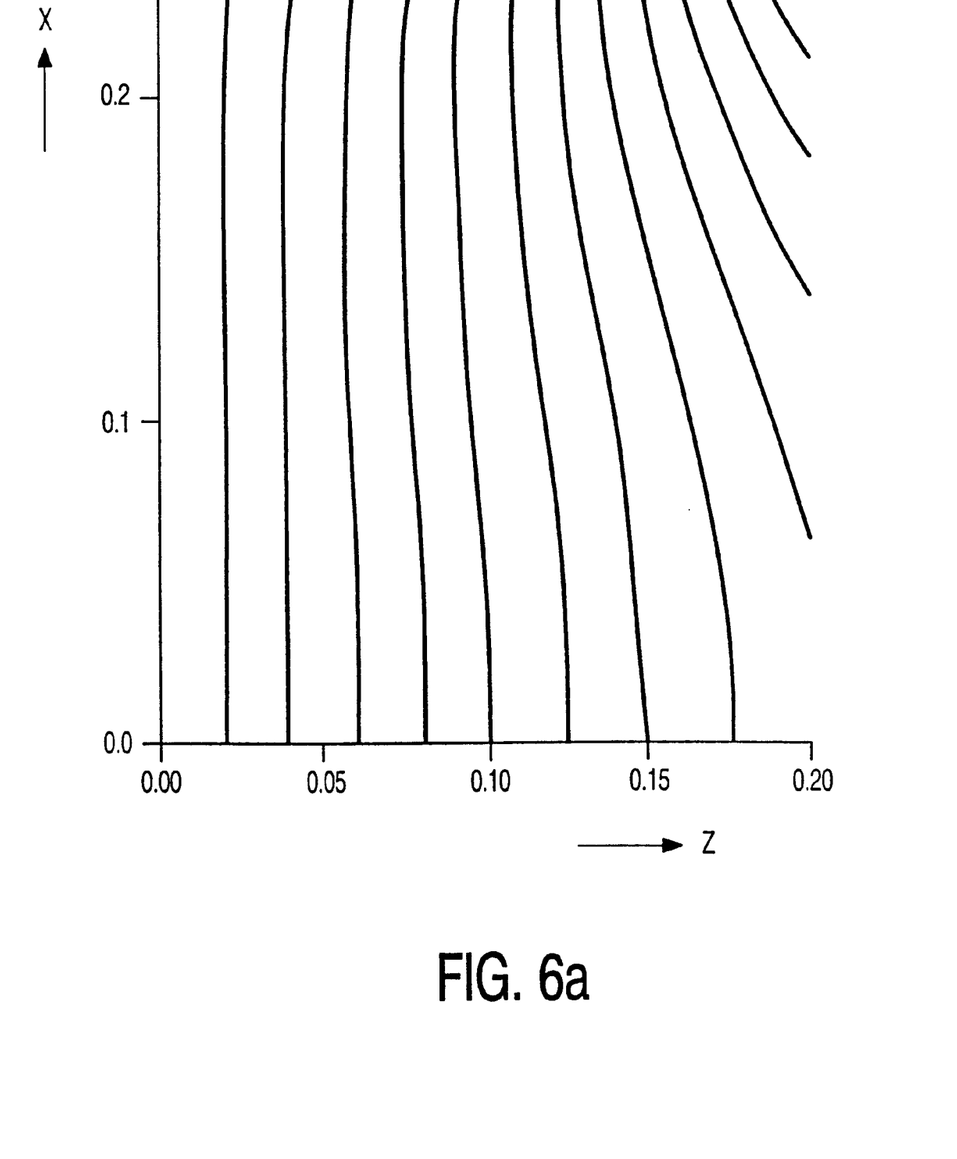

FIG. 6a shows the part of the gradient field which is generated by the z gradient coil of FIG. 5a, i.e. the z component $B_z$ of the gradient field to be generated. The field of FIG. 6a is represented by means of lines of equal field strength associated with a field strength n×200 µT. This FIG. clearly shows that the gradient filed shown is a predominantly linear field, because the derivative of the z component of the gradient field to the z co-ordinate $dB_z/dz$, i.e. the distance between the successive lines of equal field strength, is practically constant. This is notably the case on the line x=0, so on the z axis. The variation of said quantity on, for example the line x=0.2, reveals that the field shown exhibits deviations from the ideal linearity. The field shown in this FIG. has been generated by means of a current of approximately 220 A through the current lines shown in FIG. 5a. Overall, therefore, a current of approximately 2200 A has traversed the ten current lines shown therein.

Figure 6B:
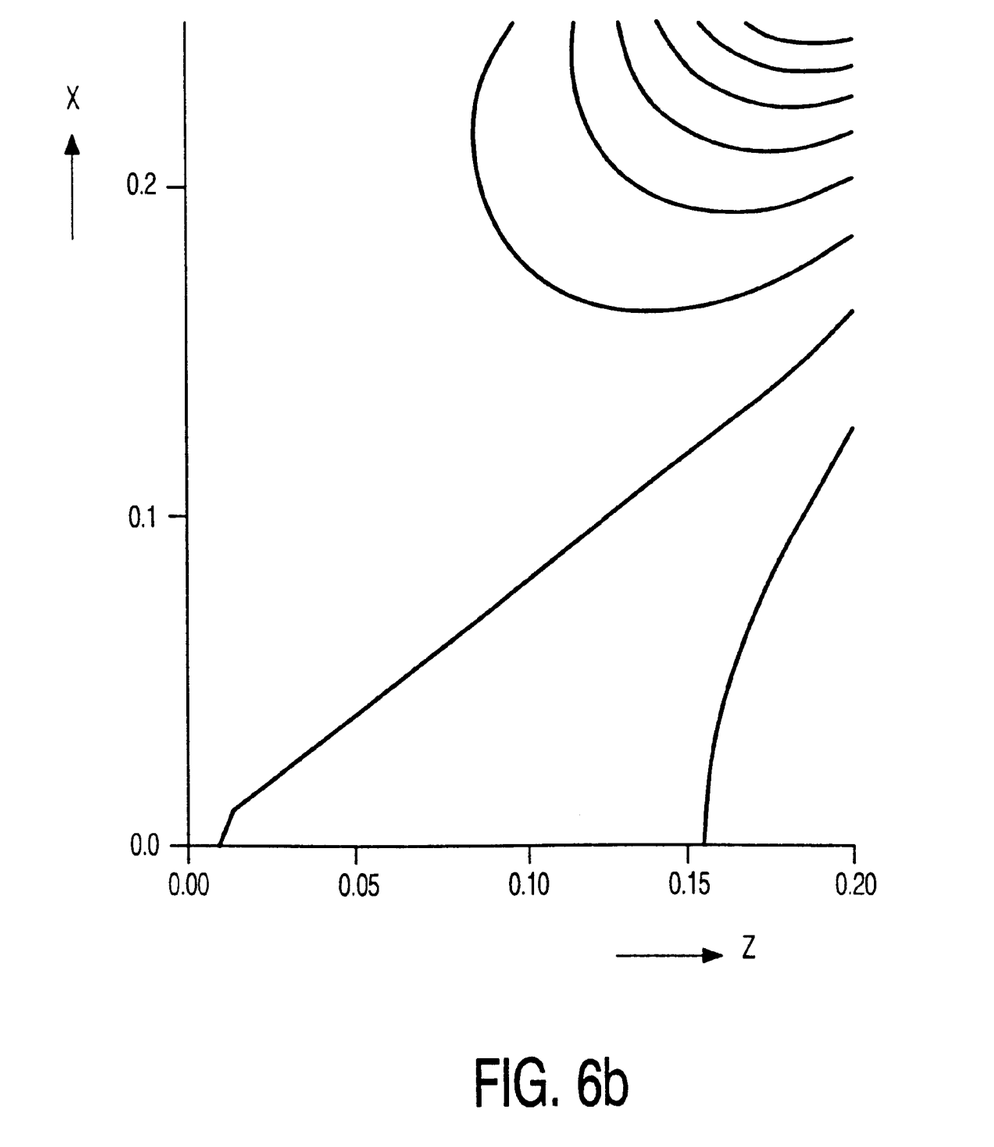
FIG. 6b shows the part of the gradient field generated by the z correction coil shown in FIG. 5b.

FIG. 6b shows the part of the gradient field which is generated by the x correction coil of FIG. 5b, i.e. the z component $B_z$ of the correction field to be generated. As opposed to the values in FIG. 6a, the lines shown in FIG. 6b are associated with a field strength n×100 µT, i.e. the field strengths on the $n^{th}$ line on the diagonal from the bottom left to the top right successively correspond to the values n=+1, n=+2, etc. and that the field strength on the $n^{th}$ in the horizontal direction as from z=0 correspond to the values n=0, n=−1, n=−2, etc. The field shown in this Figure has been generated by means of a current of approximately 130 A through the current lines 55 shown in FIG. 5b, meaning overall a current of approximately 1300 At in these current lines; furthermore, a current of the same value and the opposite direction traversed the current lines 57, meaning overall a current of approximately 650 At in these current lines 57; finally, a current of the same value and the same direction traversed the current lines 59, meaning overall a current of approximately 260 At in the current lines 59. Thus, in the current lines shown in FIG. 3b overall a current of approximately 960 At has occurred. This Figure clearly illustrates that the correction field shown is by no means a linear field, because the derivative of the z component of this field to the z co-ordinate $dB_z/dz$, i.e. the distance between the successive lines of equal field strength, is practically certainly not constant. This field can be used for correcting the field of FIG. 6a in respect of linearity.

Figure 6C:
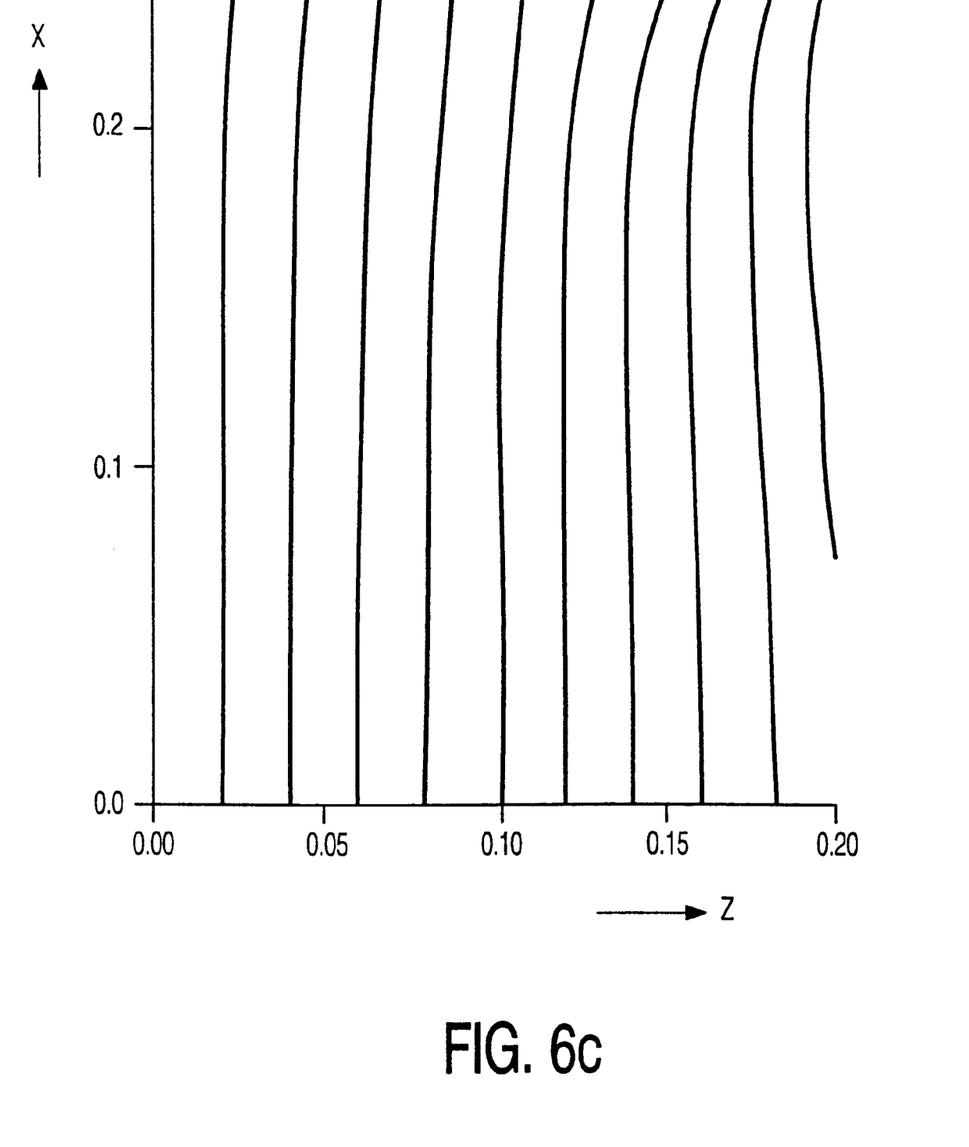
FIG. 6c shows the total z gradient field generated by the combination of the z gradient coil of FIG. 5a and the z correction coil of FIG. 5b.

FIG. 6c shows the total z gradient field generated by addition of the gradient field of the z gradient coil of FIG. 5a and the correction field of the z correction coil of FIG. 5b., Like FIG. 6a, FIG. 6c shows the lines associated with a field strength n×200 µT. This Figure clearly illustrates that the gradient field shown is linear to a higher degree than the field of FIG. 6a, because the distance between the successive lines of equal field strength is constant to a higher degree. This is visible notably on the line x=0.2 where the variation in the distances between the successive lines of equal field strength is not yet completely constant, but the differences between the distances are smaller than in the case of FIG. 6a.

Figure 7:
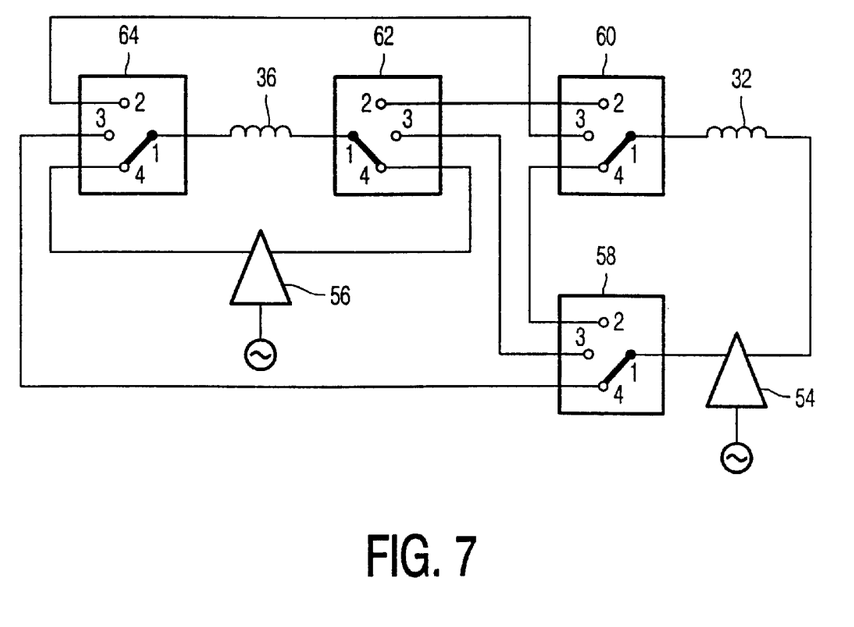
FIG. 7 shows a circuit diagram illustrating the various methods of connecting together a gradient coil and the associated correction coil according to the invention.

FIG. 7 shows a circuit diagram illustrating the various methods of combining a gradient coil and the associated correction coil according to the invention. It is assumed that the gradient coil is formed by the x gradient coil 32, but a z gradient coil could have been used equally well for this purpose. The correction coil is assumed to be the x correction coil 36. The two coils shown in FIG. 7 can be fed by a first drive amplifier 54 and a second drive amplifier 56, via switching means for driving the two coils independently or not, as desired, said switching means being formed by the switches 58, 60, 62 and 64. Each of the switches comprises a switching arm which can be adjusted to three switching positions, the three switching positions are denoted by the connection between the connection terminals 1, 2, 3 and 4 present in the switch. Thus, for example in the position of the switching arm shown the switch 60 establishes the connection 1–4.

One of the outputs of the drive amplifier 54 is permanently connected to one of the ends of the gradient coils 32, the other end of which is connected to the connection terminal 1 of the switch 60. The switch 60 also has three further connection terminals 2, 3 and 4, the connection terminal 2 being connected to the connection terminal 2 of the switch 62 whereas the connection terminal 3 is connected to the connection terminal 2 of the switch 64 and the connection terminal 4 is connected to the connection terminal 2 of the switch 58. The other output of the drive amplifier 54 is connected to the connection terminal 1 of the switch 58. The connection terminal 3 of the switch 58 is connected to the connection terminal 3 of the switch 62 and its connection terminal 4 is connected to the connection terminal 3 of the switch 64.

One of the outputs of the drive amplifier 56 is connected to the connection terminal 4 of the switch 62. The connection terminal 1 of the switch 62 is connected to one end of the correction coil 36, the other end of which is connected to the connection terminal 1 of the switch 64. The other output of the drive amplifier 56 is connected to the connection terminal 4 of the switch 64.

The diagram shown in the Figure enables switching between a number of different gradient modes. Four different operating conditions (gradient modes) are notably important, i.e. series connection of the coils 32 and 36, the current then flowing through the two coils in the same direction ("serial common"); series connection of the coils 32 and 36 in such a manner that the current through the two coils flows in opposite directions ("serial differential"); independent energizing of the coils 32 and 36 ("independent"); and energizing of the gradient coil 32 alone ("sole gradient"). The settings of the various switches for said gradient modes are given in the following Table I:

TABLE I

|           | serial common | serial diff. | independent | sole grad. |
|-----------|---------------|--------------|-------------|------------|
| switch 58 | 1–4           | 1–3          | 1–2         | 1–2        |
| switch 60 | 1–2           | 1–3          | 1–4         | 1–4        |
| switch 62 | 1–2           | 1–4          | 1–4         | X          |
| switch 64 | 1–3           | 1–2          | 1–4         | X          |

The symbols X in the last column signify that the setting of the associated switches is irrelevant. For example, if it were important to leave the coil 36 open when the gradient coil 32 is energized alone, the switch 62 can be set to the positions 1-2 or 1-3 and the switch 64 to the position 1-2.

All references cited herein are incorporated herein by reference in their entirety and for all purposes to the same extent as if each individual publication or patent or patent application was specifically and individually indicated to be incorporated by reference in its entirety for all purposes.

What is claimed is:

1. A magnetic resonance imaging apparatus which includes a gradient coil system for generating a magnetic gradient field in an imaging volume of the apparatus, the gradient coil system comprising:

a first coil for generating a first part of the gradient field, and a second coil for generating a second part of the gradient field, wherein the second coil is proportioned in such a manner that in the second part of the gradient field generated by this coil the ratio $R=(max_{dev})/(max_{lin})$ is larger than 1, where $max_{lin}$ is the maximum value of the linear component of the second part of the gradient field in the imaging volume and $max_{dev}$ is the maximum value of the deviation of the linear component of the second part of the gradient field in the imaging volume, wherein the apparatus further comprises switching means for driving the first and the second coil, mutually independently or not, as desired, and wherein the apparatus also includes a first and a second drive amplifier for driving the first coil and the second coil, respectively.

2. A magnetic resonance imaging apparatus as claimed in claim 1, in which the switching means for driving the first and the second coil independently or not, as desired, are arranged either to connect the two coils in series or to connect each of the coils to the respective drive amplifier associated with each of the coils, as desired.

3. A magnetic resonance imaging apparatus as claimed in claim 1, in which the switching means are arranged to switch over from a first gradient mode to a second gradient mode during the execution of one scan operation.

4. A magnetic resonance imaging apparatus as claimed in claim 1 wherein the first coil further comprises an associated shielding coil and wherein the second coil further comprises with an associated shielding coil.

5. A magnetic resonance imaging apparatus as claimed in claim 4, in which an intermediate space exists between the first coil and the associated shielding coil, the second coil being accommodated in said intermediate space.

6. A magnetic resonance imaging apparatus as claimed in claim 5, in which the shielding coil associated with the second coil is also accommodated in the intermediate space.

7. A magnetic resonance imaging apparatus as claimed in claim 1 further comprising an RF coil which is situated within the first coil, the second coil being constructed as a split coil which consists of two sub-coils, the two sub-coils being situated to both sides of the RF coil within the first coil.

8. The apparatus of 2 wherein the switching means are arranged to switch over from a first gradient mode to a second gradient mode during the execution of one scan operation.

9. The apparatus of claim 4 further comprising an RF coil which is situated within the first coil, the second coil being constructed as a split coil which consists of two sub-coils, the two sub-coils being situated to both sides of the RF coil within the first coil.

* * * * *